(12) United States Patent
Yeh et al.

(10) Patent No.: US 8,288,863 B2
(45) Date of Patent: Oct. 16, 2012

(54) SEMICONDUCTOR PACKAGE DEVICE WITH A HEAT DISSIPATION STRUCTURE AND THE PACKAGING METHOD THEREOF

(75) Inventors: Chia-Feng Yeh, Banqiao (TW); Chung-Hwa Wu, Tainan (TW); Shao-Kang Hung, Pingtung (TW)

(73) Assignee: Global Unichip Corporation, Hsinchu (TW)

( * ) Notice: Subject to any disclaimer, the term of this patent is extended or adjusted under 35 U.S.C. 154(b) by 0 days.

(21) Appl. No.: 12/929,544

(22) Filed: Feb. 1, 2011

(65) Prior Publication Data

US 2012/0104581 A1    May 3, 2012

(30) Foreign Application Priority Data

Nov. 2, 2010    (TW) .............................. 99137571 A

(51) Int. Cl.
*H01L 23/34* (2006.01)
*H01L 23/10* (2006.01)

(52) U.S. Cl. ........ 257/707; 257/678; 257/706; 257/778; 257/E21.503; 257/E21.506; 257/E23.069; 257/E23.092; 438/113; 438/121; 438/122; 438/124; 438/125

(58) Field of Classification Search .................. 257/678, 257/706, 707, 778, E21.503, E21.506, E23.092, 257/E23.069; 438/113, 121, 122, 124, 125
See application file for complete search history.

(56) References Cited

U.S. PATENT DOCUMENTS

| | | | |
|---|---|---|---|
| 5,977,626 A * | 11/1999 | Wang et al. .................... | 257/707 |
| 6,081,027 A * | 6/2000 | Akram .......................... | 257/707 |
| 6,806,567 B2 * | 10/2004 | Hembree ....................... | 257/707 |
| 6,936,929 B1 * | 8/2005 | Mostafazadeh et al. ...... | 257/778 |
| 6,946,729 B2 * | 9/2005 | Lee et al. ....................... | 257/707 |
| 7,768,107 B2 * | 8/2010 | Bauer et al. ................... | 257/678 |
| 2006/0231944 A1 * | 10/2006 | Huang et al. .................. | 257/706 |
| 2009/0262290 A1 * | 10/2009 | Sampica et al. ............... | 349/122 |

* cited by examiner

*Primary Examiner* — Dao H Nguyen
(74) *Attorney, Agent, or Firm* — Bacon & Thomas, PLLC

(57) ABSTRACT

The present invention provide a heat dissipation structure on the active surface of the die to increase the performance of the heat conduction in longitude direction of the semiconductor package device, so that the heat dissipating performance can be improved when the semiconductor package device is associated with the exterior heat dissipation mechanism.

10 Claims, 5 Drawing Sheets

SEMICONDUCTOR PACKAGE DEVICE WITH A HEAT DISSIPATION STRUCTURE AND THE PACKAGING METHOD THEREOF

BACKGROUND OF THE INVENTION

1. Field of the Invention

The present invention related to a semiconductor package device, and more particularly to dispose the heat dissipation structure with a higher heat conductive coefficient on the die to increase the heat dissipation efficiency for the semiconductor package device.

2. Description of the Prior Art

Please refer to FIG. 1, which shows a cross-sectional view of the conventional ball grid array (BGA) package device. BGA package device 100 includes a semiconductor die 120 which is disposed on carrier substrate 110 (or substrate 110), and is electrically connected carrier substrate 110 via the plurality of conductive wire 130. A plurality of connecting components 150 is disposed on the back surface (not shown) of carrier substrate 110 corresponding to the top surface (not shown) of carrier substrate 110. The coefficient of thermal expansion of the die 120 is about $2.5 \times 10-6/K \sim 3.5 \times 10-6/K$. According to the heat dissipation during the operation of the semiconductor package device, heat dissipation structure 160 is disposed on package body 140 and the top surface of carrier substrate 110 to increase the heat dissipation efficiency of semiconductor package device as shown in FIG. 2.

PBGA (Plastic ball grid array) is one of the IC package techniques available for a die, the mainly dissipation mechanism comes from the printed circuit board with larger dissipation area. When the heat is transferred to the printed circuit board through the holes (now shown) of the carrier substrate or through the solder ball, the printed circuit board has enough space and the air to perform a heat exchange process via the heat conversion and heat radiation to dissipate the heat. According to the proportion of the heat dissipation, the 85%~95% of heat is dissipated from this dissipation path which is generated from the die. Thus, the heat dissipating performance of PBGA is depended on the design of the printed circuit board. When the requirement of the package system tends to small-scale, the heat dissipation would be an issue for the printed circuit board is to be shrunk. Thus, a heat dissipation mechanism is added on the top of the package body which is a commonly method. By increasing the heat dissipation path on the top of the package body, the dissipation proportion of the heat source of die is increased from 5%~10% to 15%~25%. Unfortunately, the heat dissipating performance would be limited due to the dissipation of the heat source is fixed under a proportion. Therefore, the dissipation limitation of the package device cannot break the dissipation requirement is about 10 Watts. The dissipation limitation of the package device is the thickness of the package device, according to the wire bond design rule to regulate the distance between the top of the conductive wire and the package body and the distance of the top of the conductive wire is electrically connected the carrier substrate that is not to be small than 4 miles. Thus, the thickness of the top of the die must be larger than the 8 miles. The coefficient of thermal expansion for filing materials is about 0.1 W/m-K~1.0 W/m-K, which is disposed between the top of the conductive and the package body. Thus, the heat conduction is to be limited, the design and the application for the improved BGA package device with heat dissipation structure cannot provide the heat conduction in longitude direction in this gap between the package body and the conductive wire, and the design and the application for the improved BGA package device with heat dissipation structure merely increases the heat dissipation in plane surface of the package device. Thus, the important issue is to solve the lower heat conduction in longitude direction to increase the heat dissipating performance of the PBGA with the exterior heat dissipation structure.

SUMMARY OF THE INVENTION

According to above problems, the primary objective of the present invention is to provide a heat dissipation structure which has a higher coefficient of thermal expansion that is disposed fixedly on the die to increase the heat conduction performance in longitude direction for the semiconductor package device and to decrease the thickness of the gap between the die and the package body.

Another objective of the present invention is to provide a heat dissipation structure which has a higher coefficient of thermal expansion that is disposed fixedly on the die to increase the heat dissipation for the exterior heat dissipation structure so as to the area of the heat dissipation structure is to be decreased and the manufacturing cost is to be decreased.

Another objective of the present invention is to dispose a heat dissipation structure on the active surface of the die to increase the performance of the heat conduction in longitude direction of the semiconductor package device, so that the heat dissipating performance can be improved when the semiconductor package device is associated with the exterior heat dissipation mechanism.

Another objective of the present invention is to provide a semiconductor package device with heat dissipation structure to increase the application of the semiconductor package device, when the high power die needs to determine the type to be packaged, the semiconductor package device with a heat dissipation structure can provide the good heat dissipation efficiency as the FCBGA package device.

According to aforementioned, the present invention provide a method for packaging a semiconductor package device with heat dissipation structure, which includes: providing a wafer having a top surface and a back surface, and having a plurality of dices thereon; sawing the wafer to obtain the plurality of dices, each plurality of dices having an active surface and a back surface, and a plurality of pads is disposed on the active surface of each the plurality of dices; providing a carrier substrate having a top surface and a back surface, a plurality of first connecting points that is disposed on the top surface and a plurality of second connecting points corresponding to the plurality of first connecting points that is disposed on the back surface, and a plurality of chip-placement areas is disposed on the top surface; attaching each the plurality of dices on each the plurality of chip-placement areas, the back surface of each the plurality of dices is disposed on each the plurality of chip-placement area on the top surface of the carrier surface; performing a wire bonding process to form a plurality of conductive wires to electrically connect the plurality of pads on the active surface of each the plurality of dices with the plurality of first connecting points on the top surface of the carrier substrate; forming a heat dissipation structure on the active surface of each the plurality of dices and is electrically isolated from the plurality of pads; performing an encapsulation process to form a polymer material to encapsulate the plurality of dices, said heat dissipation structure, the plurality of conductive wires and the top surface of said carrier substrate to form a package body; forming a plurality of connecting components on the back surface of the carrier substrate and is electrically connected the plurality of second connecting points; and cutting said package body to obtain a plurality of semiconductor package device.

According to above packaging method, the present invention also provides a semiconductor package device with heat dissipation structure, which includes: a carrier substrate having a top surface and a back surface, a plurality of first connecting points is disposed on the top surface and a plurality of second connecting points corresponding to the plurality of first connecting points that is disposed on the back surface of the carrier substrate; a die having an active surface and a back surface, and a plurality of pads on the active surface of the die, the back surface of the die is attached on the top surface of the carrier substrate; a plurality of conductive wires is electrically connected the plurality of pads on said active surface of the die with s the plurality of first connecting points on the top surface of the carrier substrate; a heat dissipation structure is disposed on the active surface of the die and is electrically isolated from the plurality of pads; a package body encapsulated the die, the plurality of conductive wires, the heat dissipation structure and portion of the top surface of the carrier substrate; and a plurality of connecting components is disposed on the back surface of the carrier substrate and is electrically connected the plurality of second connecting points.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention will now be described more fully hereinafter with reference to the accompanying drawings, in which preferred embodiments are shown. The objective of the present invention is to provide a method for packaging semiconductor package device. In the following, the well-known knowledge regarding the of the invention such as the formation of chip and the process for forming package structure would not be described in detail to prevent from arising unnecessary interpretations. However, this invention will be embodied in many different forms and should not be construed as limited to the embodiments set forth herein.

Figure 1:
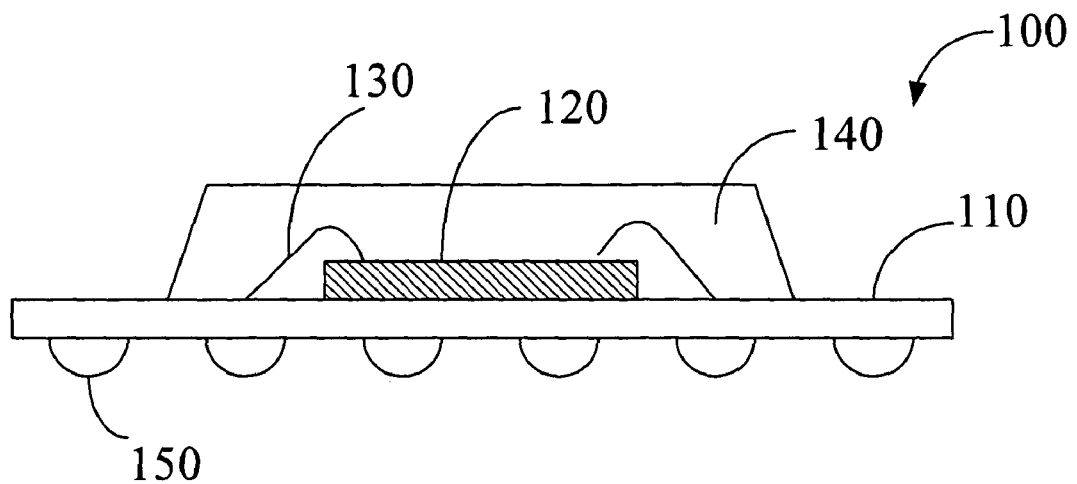
FIG. 1 shows a cross-sectional view of the BGA (ball grid array) package device according to the conventional prior art.
Figure 2:
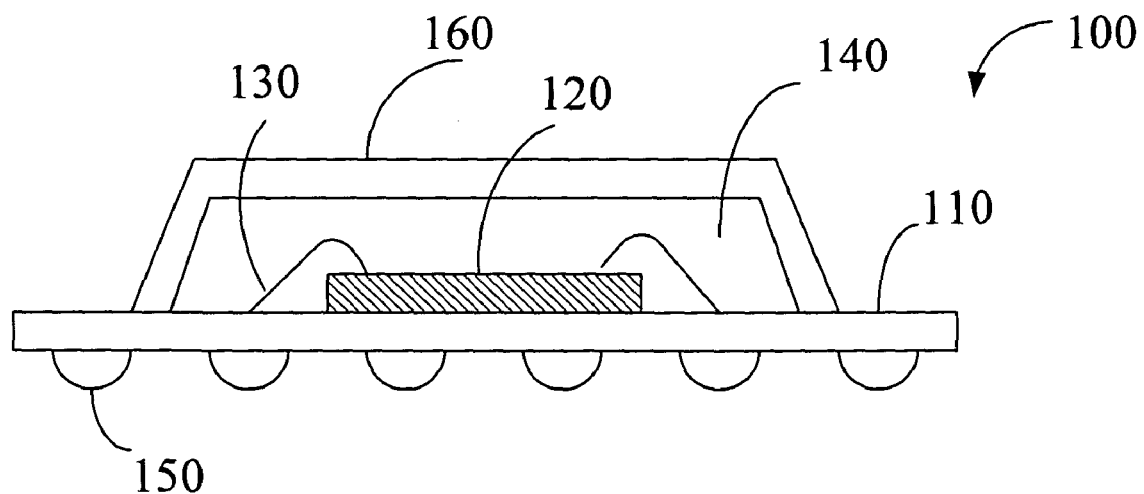
FIG. 2 shows a cross-sectional view of the BGA package device with the heat slug according to the conventional prior art.
Figure 3:
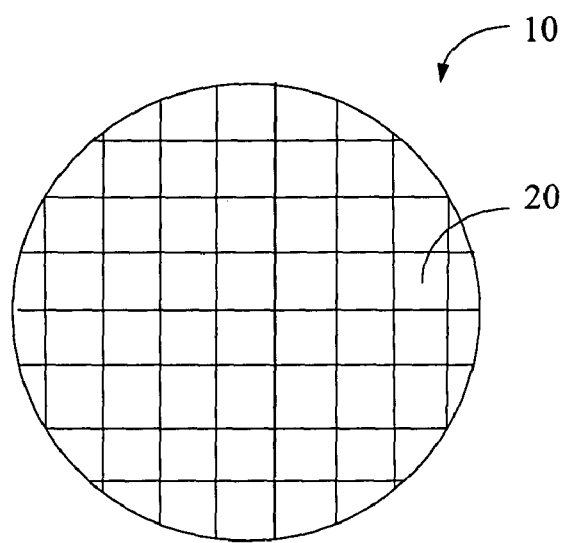
FIG. 3 shows a vertical view of the wafer according to the present invention disclosed herein.

Please refer to FIG. 3, which shows a vertical view of the wafer. In FIG. 3, a wafer 10 is provided which having a top surface (not shown in Figure) and a back surface (not shown in Figure), and a plurality of dices 20 is disposed thereon. Next, according to sawing line (not shown in Figure) on the wafer 10, the wafer 10 is cut by the cutting-off tools (not shown in Figure) to obtain a plurality of dices 20 as shown in FIG. 4.

Figure 4:
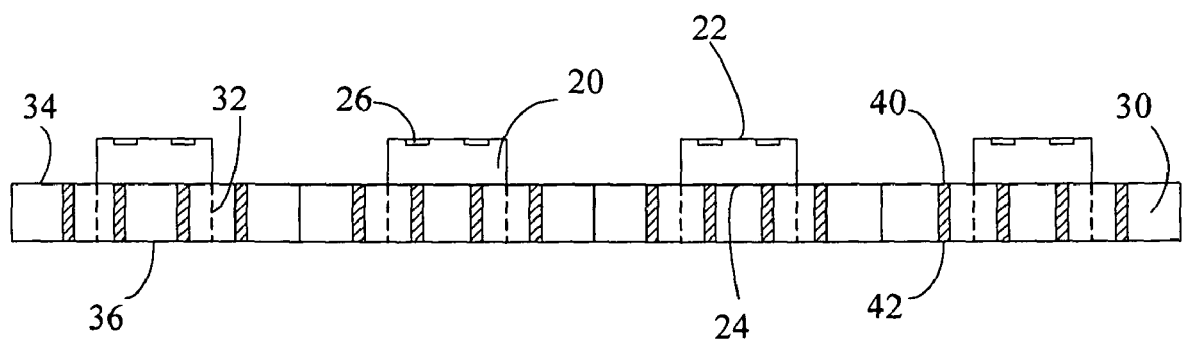
FIG. 4 shows a cross-sectional view of the plurality of dices that is disposed on the plurality of chip-placements area on the carrier substrate according to the present invention disclosed herein.

In this embodiment of FIG. 4, each the plurality of dice 20 having an active surface 22 and a back surface 24, and a plurality of pads 26 is disposed on the active surface 22 of each the plurality of dices 20. Next, please also refer to FIG. 4, a carrier substrate 30 having a top surface 34 and a back surface 36 is provided, and a plurality of chip-placement areas (the dotted line region) 32 is disposed on the top surface 34 of the carrier substrate 30. A plurality of first connecting points 40 is disposed on top surface 34 of each of the plurality of chip-placement area 32 and a plurality of second connecting points 42 corresponding to the plurality of first connecting points 40 is disposed on the back surface 36 of the carrier substrate 30. Next, the active surface 22 of each the plurality of dice 20 is upward to dispose on each of the plurality of chip-placement areas 32 on the top surface 34 of the carrier substrate 30. In this embodiment, an adhesive layer (not shown in Figure) is further disposed between the back surface 24 of each of the plurality of dices 20 and the top surface 34 of the carrier substrate 30 to fix each of the plurality of dices 20 on the top surface 34 of the carrier substrate 30.

Figure 5:
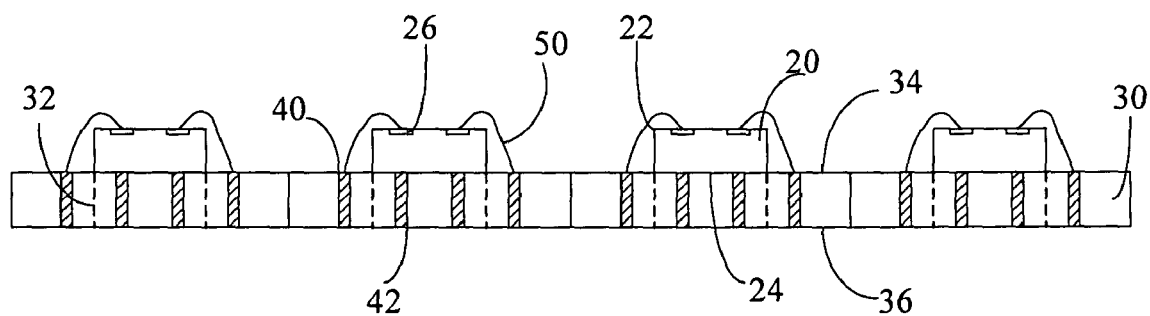
FIG. 5 shows a cross-sectional view of the plurality of conductive wires is formed on the plurality of dices by wire bonding process to electrically connect the plurality of dices with the carrier substrate according to the present invention disclosed herein.

Next, please refer to FIG. 5 which shows a cross-sectional view of the plurality of conductive wires that electrically connected the die with the carrier substrate. In FIG. 5, the plurality of conductive wires 50 is formed on the plurality of pads 26 on the active surface 22 of each of the plurality of dices 20 by wire bonding process, and is electrically connected with the plurality of connecting points 40 on the top surface 34 of the carrier substrate 30.

Figure 6A:
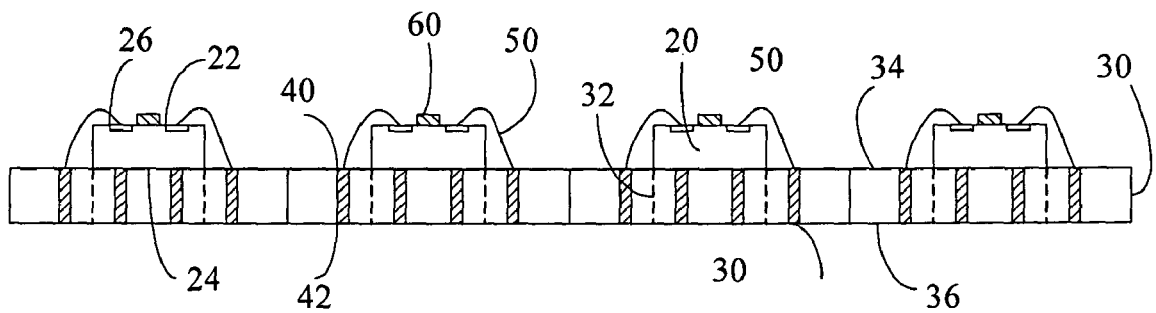
FIG. 6A shows a cross-sectional view of each the plurality of heat dissipation structures that is disposed on the active surface of each the plurality of dices according to the present invention disclosed herein.

Please refer to FIG. 6A, a heat dissipation structure 60 is disposed on the active surface 22 of each of the plurality of dices 20 after the wire bonding process is performed. The heat dissipation structure 60 is disposed in the middle of the plurality of pads 26 on the active surface 22 of each of the plurality of dices 20 by silver paste or non-conductive glue and is electrically isolated from the plurality of pads 26. The purpose of the utilization of the heat dissipation structure 60 is that the heat dissipation structure having a higher coefficient of thermal expansion to increase the heat conduction performance for the semiconductor package device in longitude direction. In this embodiment, the material of the heat dissipation structure 60 is copper whose heat conduction coefficient k being about 389 W/m-K, Copper-contained metal compound, Aluminum whose heat conduction coefficient k being about 210 W/m-K, or Aluminum-contained metal compound. In addition, the shape of the heat dissipation structure 60 is cylinder, rectangle cylinder, non-uniform cylinder, and non-uniform rectangle cylinder.

Figure 6B:
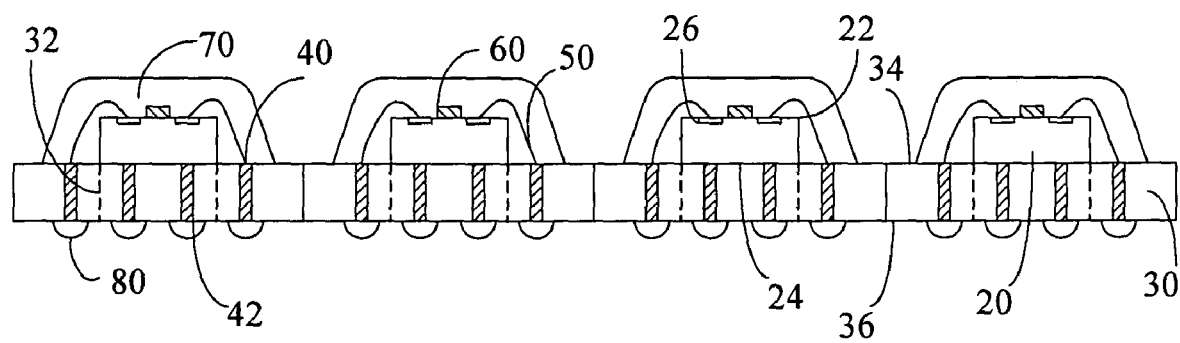
FIG. 6B shows a cross-sectional view of polymer material that is formed to encapsulate the die with the heat dissipation structure according to the present invention disclosed herein.

Next, please refer to FIG. 6B, which shows a cross-sectional view of performing an encapsulation process to form a package body to encapsulate the plurality of dices, the plurality of conductive wires, and portion of the top surface of the carrier substrate. In FIG. 6B, a polymer material such as epoxy resin is formed on each the plurality of dices 20 to encapsulate the plurality of dices 20, the plurality of conductive wires 50, the heat dissipation structure 60 and the portion of the top surface 12 of the carrier substrate 10 to form a package body 70.

Figure 6C:
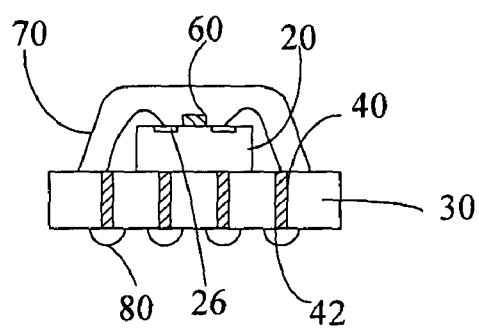
FIG. 6C shows a cross-sectional view of a semiconductor package device is finished according to the present invention disclosed herein.

Please refer to FIG. 6C, a plurality of connecting components 80 is formed on the back surface 36 of the carrier substrate 30 and is electrically connected to the plurality of second connecting points 42. In this embodiment, the plurality of connecting elements 80 is solder ball. Then, the carrier substrate 30 is cut by the cutting-off tools (not shown) according to the sawing line (not shown) on the carrier substrate 30 to obtain a plurality of semiconductor package device.

In addition, the present invention also provides another embodiment for packaging the semiconductor package device, the packaging procedure is the same as the FIG. 3 to FIG. 5 as aforementioned, the different between the above embodiment is that heat dissipation structure 62 is disposed in the middle of the plurality of pads 26 on the active surface 22 of each the plurality of dices 20 after the wire bonding process is performed. The height of the heat dissipation structure 62 is higher than the arc of the plurality of conductive wires 50 as shown in FIG. 7A.

Figure 7A:
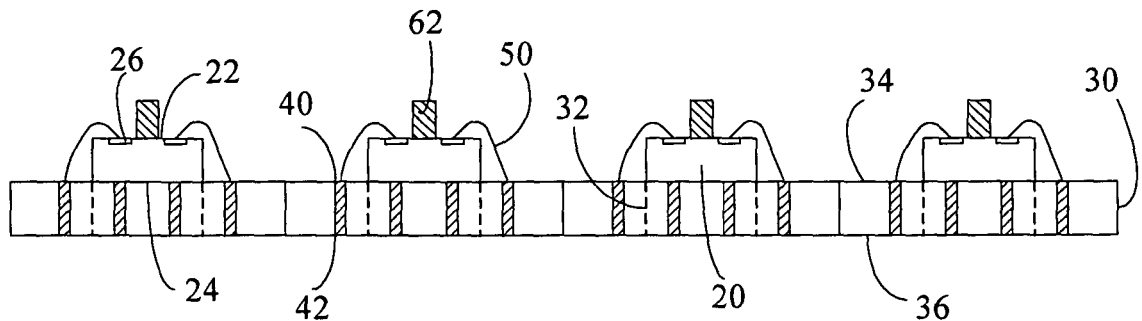
FIG. 7A shows a cross-sectional view of a plurality of heat dissipation structure that is disposed on the active surface of each the plurality of dices according to the present invention disclosed.

Similarly, FIG. 7A shows that the heat dissipation structure 62 is disposed in the middle of the plurality of pads 26 on active surface 22 of each of the plurality of dices 20 and is electrically isolated from the plurality of pads 26. The purpose of the utilization of heat dissipation structure 62 is that the heat dissipation structure having a higher coefficient of thermal expansion to increase the heat conducting performance for the semiconductor package device in longitude direction. In this embodiment, the material of the heat dissipation structure 62 is Copper whose heat conduction coefficient k being about 389 W/m-K, Copper-contained metal compound, Aluminum whose heat conduction coefficient k being about 210 W/m-K, or Aluminum-contained metal compound. In addition, the shape of heat dissipation structure 62 is cylinder, rectangle cylinder, non-uniform cylinder, and non-uniform rectangle cylinder.

Figure 7B:
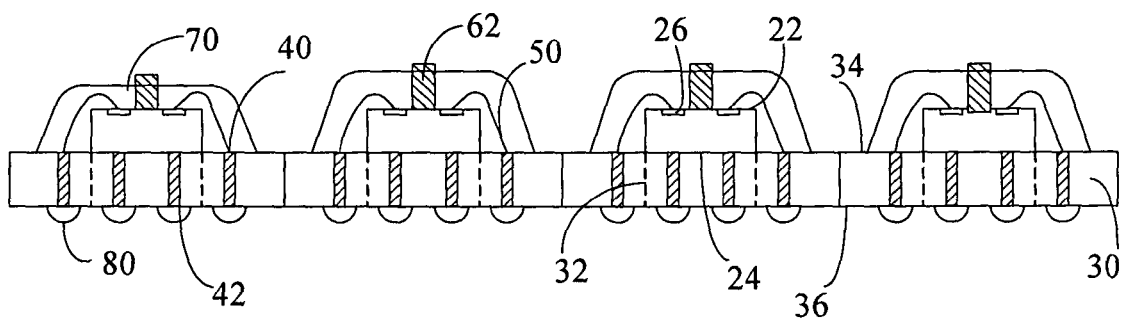
FIG. 7B shows a cross-sectional view of the polymer material that encapsulated the die with the heat dissipation structure and the heat dissipation structure is to be exposed according to the present invention disclosed herein.

Thereafter, as shown in FIG. 7B, a polymer material such as epoxy resin is formed on each of the plurality of dices 20 to encapsulate the plurality of dices 20, the plurality of conductive wires 50, the heat dissipation structure 62 and portion of the top surface 34 of the carrier substrate 30 to form package body 70. Because the height of the heat dissipation structure 62 is higher than the arc of the plurality of conductive wires 50, the portion of the heat dissipation structure 62 is to be exposed out of the package body 70 after the encapsulation process is performed. The purpose of this semiconductor package device with the heat dissipation structure is to decrease the gap between heat dissipation structure 62 and package body 70, so that the heat dissipation efficiency can be increased.

Figure 7C:
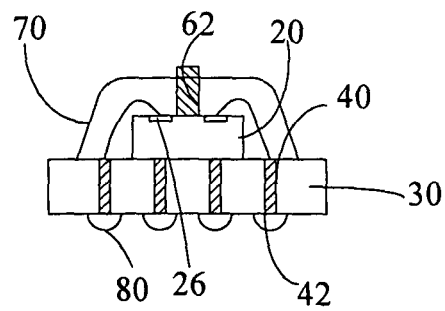
FIG. 7C shows a cross-sectional view of a semiconductor package device is finished according to the present invention disclosed herein.

Finally, referring to FIG. 7C, a plurality of connecting components 80 is disposed on the back surface 36 of the carrier substrate 30 and is electrically connected the plurality of second points 42 on the back surface 34 of the carrier substrate 30. In this embodiment, the plurality of connecting components 80 is solder ball. Next, the carrier substrate 30 is cut by the cutting-off tools (not shown) according to the sawing line (not shown) on the carrier substrate 10 to obtain a plurality of semiconductor package device.

Thus, according to above embodiments, the semiconductor package device with the heat dissipation structure can apply for the HSBGA (heat slug ball grid array) package device, the heat dissipation performance semiconductor package device with the heat dissipation structure of the present invention is the same as that of HFCBGA (high performance flip chip ball grid array) package device. In addition, the semiconductor package device with the heat dissipation structure of the present invention having a simple structure and simple manufacturing process than that of the conventional semiconductor package device with the heat slug, so that the cost and the yield can be maintained.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for a packaging semiconductor package device with a heat dissipation structure, comprising:

providing a wafer having a top surface and a back surface, and having a plurality of dices disposed thereon;

cutting said wafer to obtain said plurality of dices, each said plurality of dices having an active surface and a back surface, and a plurality of pads is disposed on said active surface of each said plurality of dices;

providing a carrier substrate having a top surface and a back surface, a plurality of first connecting points being disposed on said top surface and a plurality of second connecting points corresponding to said plurality of first connecting points being disposed on said back surface, and a plurality of chip-placement areas being disposed on said top surface;

attaching each said plurality of dices on each said plurality of chip-placement areas, said back surface of each said plurality of dices being disposed on each said plurality of chip-placement areas on said top surface of said carrier surface;

performing a wire bonding process to form a plurality of conductive wires to electrically connect said plurality of pads on said active surface of each said plurality of dices with said plurality of first connecting points on said top surface of said carrier substrate;

forming the heat dissipation structure on said active surface of each said plurality of dices and being electrically isolated from said plurality of pads;

performing an encapsulation process to form a polymer material to encapsulate said plurality of dices, said heat dissipation structure, said plurality of conductive wires and said top surface of said carrier substrate to form a package body;

forming a plurality of connecting components on said back surface of said carrier substrate and being electrically connected said plurality of second connecting points; and cutting said package body to form a plurality of semiconductor package device.

2. The packaging method according to claim 1, wherein said carrier substrate comprises a printed circuit board.

3. The packaging method according to claim 1, wherein said heat dissipation structure is directly connected to said plurality of dices.

4. The packaging method according to claim 1, further comprising a conductive glue disposed between said top surface of said carrier substrate and said back surface of each of said plurality of dices.

5. The packaging method according to claim 1, wherein said heat dissipation structure comprises a metal.

6. The packaging method according to claim 1, wherein the material of said heat dissipation structure is selected from the group consisting of copper, copper-contained metal compound, aluminum, and aluminum-contained metal compound.

7. The packaging method according to claim 1, wherein the shape of said heat dissipation structure is selected from the group consisting of cylinder, non-uniform cylinder, rectangle cylinder, and non-uniform rectangle cylinder.

8. The packaging method according to claim 1, wherein a silver paste is further disposed between said heat dissipation structure and said active surface of each said plurality of dices.

9. The packaging method according to claim 1, wherein a non-conductive glue is further disposed between said heat dissipation structure and said active surface of each said plurality of dices.

10. The packaging method according to claim 1, wherein said heat dissipation structure protrudes from said package body.

* * * * *